(12) United States Patent
Roy et al.

(10) Patent No.: US 7,964,928 B2
(45) Date of Patent: Jun. 21, 2011

(54) PHOTODETECTOR WITH AN IMPROVED RESOLUTION

(75) Inventors: François Roy, Seyssins (FR); Thomas Girault, Grenoble (FR); Yann Marcellier, Grenoble (FR); Caroline Bringolf-Penner, Revel (FR)

(73) Assignee: STMicroelectronics S.A., Montrouge (FR)

( * ) Notice: Subject to any disclaimer, the term of this patent is extended or adjusted under 35 U.S.C. 154(b) by 1248 days.

(21) Appl. No.: 11/602,053

(22) Filed: Nov. 20, 2006

(65) Prior Publication Data

US 2007/0114627 A1 May 24, 2007

(30) Foreign Application Priority Data

Nov. 22, 2005 (FR) ...................................... 05 53550

(51) Int. Cl.
 *H01L 31/00* (2006.01)
(52) U.S. Cl. ................. 257/440; 257/E31.001
(58) Field of Classification Search ............. 257/440, 257/445, E31.033, E31.035, E31.001; 438/80, 438/81
See application file for complete search history.

(56) References Cited

U.S. PATENT DOCUMENTS

| | | |
|---|---|---|
| 4,533,940 A | 8/1985 | Chappell et al. |
| 4,791,396 A | 12/1988 | Nishizawa et al. |
| 5,283,460 A * | 2/1994 | Mita .............................. 257/432 |
| 5,801,373 A * | 9/1998 | Oozu et al. ................. 250/208.1 |
| 6,403,998 B1 | 6/2002 | Inoue |
| 2002/0050593 A1 | 5/2002 | Fukunaga et al. |
| 2004/0080638 A1* | 4/2004 | Lee ................. 348/272 |

FOREIGN PATENT DOCUMENTS

| | | | |
|---|---|---|---|
| JP | 61285760 A | 12/1986 |
| JP | 06205158 A | 7/1994 |
| JP | 11233747 A | 9/1999 |
| JP | 2005322739 A | 11/2005 |

OTHER PUBLICATIONS

French Search Report from corresponding French Application No. 05553550 filed Nov. 22, 2005.

* cited by examiner

*Primary Examiner* — Matthew S Smith
*Assistant Examiner* — Daniel Shook
(74) *Attorney, Agent, or Firm* — Lisa K. Jorgenson; William R. McClellan; Wolf, Greenfield & Sacks, P.C.

(57) ABSTRACT

A photodetector made in monolithic form in a lightly-doped substrate of a first conductivity type. This photodetector includes at least two photodiodes and includes a first region of the first conductivity type more heavily doped than the substrate extending at least between the two photodiodes; and a second region of the first conductivity type more heavily doped than the substrate and extending under the first region and under one of the two photodiodes, the first region or the second region, with the first region, delimiting a substrate portion at the level of said one of the two photodiodes, and the second region, with the first region, delimiting an additional substrate portion at the level of the other one of the two photodiodes.

10 Claims, 3 Drawing Sheets

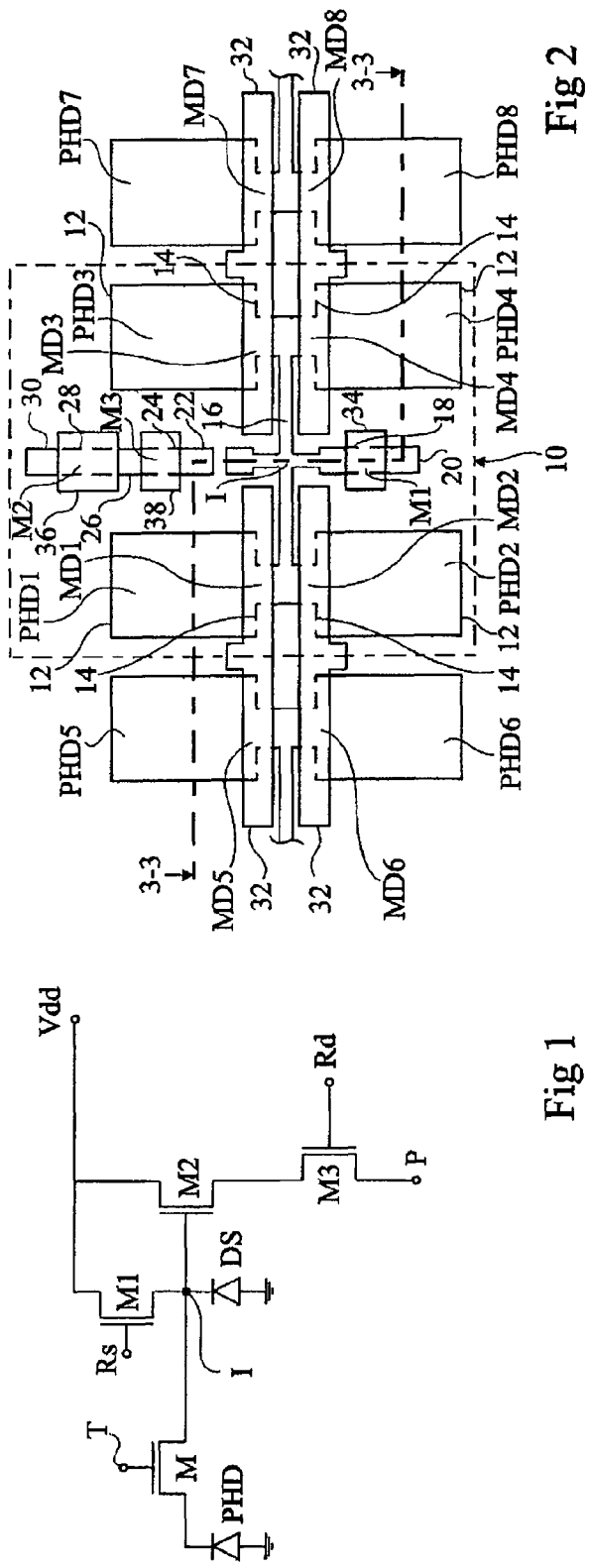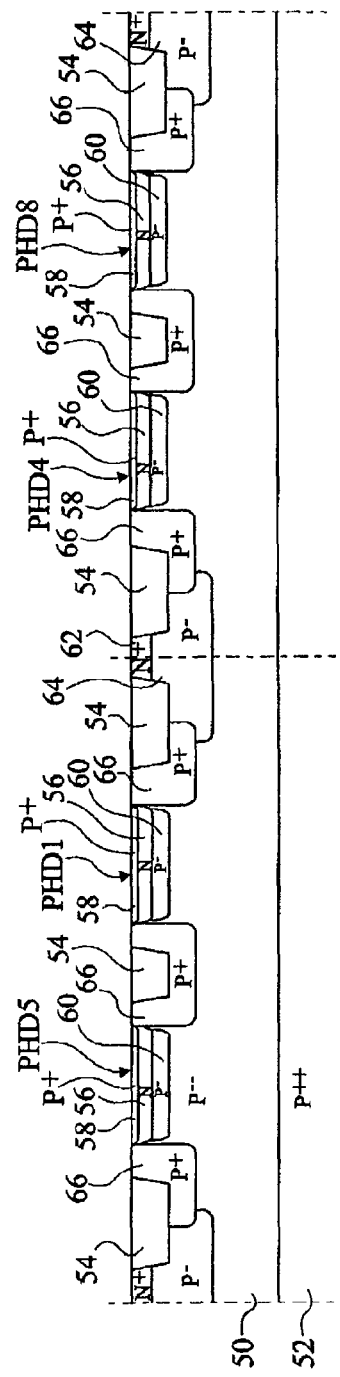
Fig 1
Fig 2
Fig 3

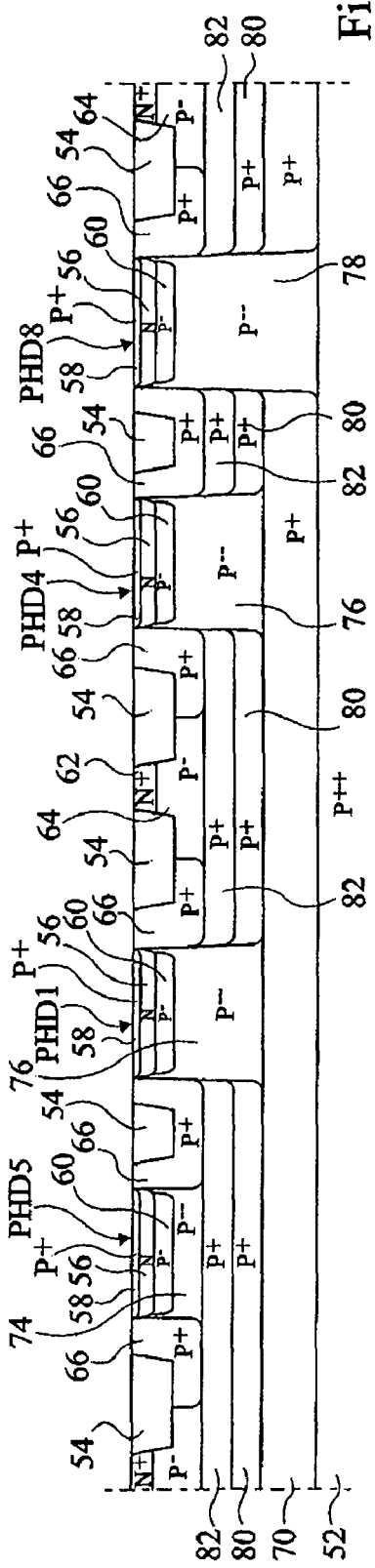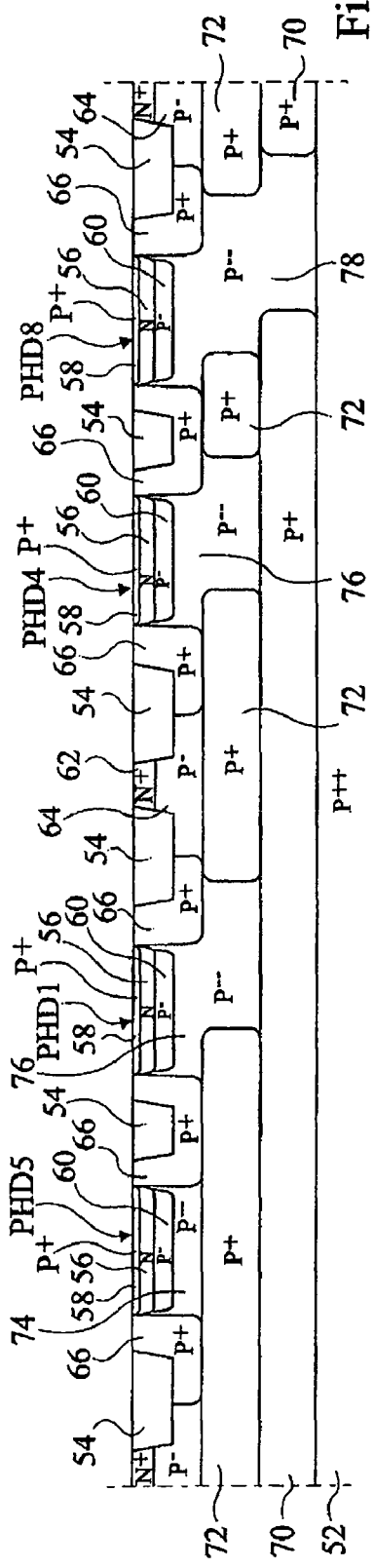

PHOTODETECTOR WITH AN IMPROVED RESOLUTION

BACKGROUND OF THE INVENTION

1. Field of the Invention

The present invention relates to the manufacturing, in monolithic form, of image sensors intended to be used in image capture devices such as, for example, cameras, camcorders, digital microscopes, or again digital photographic cameras.

2. Discussion of the Related Art

FIG. 1 partially illustrates a cell of an image sensor array. With each array cell are associated a precharge device and a read device. The precharge device is formed of an N-channel MOS transistor M1, disposed between a supply rail Vdd and a node I. The gate of precharge transistor M1 is capable of receiving a precharge control signal Rs. The read device is formed of the series connection of two N-channel MOS transistors. The drain of a first one of these read transistors, called M2 hereafter, is connected to supply rail Vdd. The source of second read transistor M3 is connected to input terminal P of an electronic processing circuit. The gate of first read transistor M2 is connected to node I. The gate of second read transistor M3 is capable of receiving a read signal Rd. The cell comprises a photodiode PHD. Node I is associated with a charge storage diode DS. The anode of diodes PHD and DS is connected to a reference supply rail or ground of the circuit GND. The cathode of diode DS is directly connected to node I. The cathode of photodiode PHD is connected to node I by a charge transfer N-channel MOS transistor MD. The gate of transfer transistor MD is capable of receiving a charge transfer control signal T.

The operation of this circuit will now be described. A photodetection cycle starts with a precharge phase during which a reference voltage level is imposed to diode DS. This precharge is performed by turning off second read transistor M3 and by turning on precharge transistor M1. Once the precharge has been performed, precharge transistor M1 is turned off. Then, the system is maintained as such, all transistors being off. A given time after the end of the precharge, the state at node I, that is, the real reference charge state of diode DS, is read. To evaluate the charge state, second read transistor M3 is turned on for a very short time. The cycle carries on with a transfer to node I of the photogenerated charges, that is, the charges created and stored in the presence of radiation, in photodiode PHD. This transfer is performed by turning on transfer transistor MD. Once the transfer is over, transistor MD is turned off and photodiode PHD starts photogenerating and storing charges which will be subsequently transferred to node I again. Simultaneously, at the end of the transfer, the new charge state of diode DS is read. The output signal transmitted to terminal P then depends on the pinch of the channel of first read transistor M2, which directly depends on the charge stored in the photodiode.

In practice, a cell comprises several photodiodes which are each connected to node I via an associated transfer transistor. The previously-described read method is then successively carried out for each photodiode in the cell.

FIG. 2 shows a partial simplified top view of an example of a cell 10 of an image sensor made in monolithic form. A full line shows the limit of an active N-type or P-type doped silicon area or a polysilicon portion. A dotted line shows the limit of an active doped silicon area located under a polysilicon portion.

Cell 10 comprises four photodiodes PHD1 to PHD4, each photodiode being connected to node I by an associated transfer transistor MD1 to MD4. To the left and to the right of cell 10, photodiodes PHD5 to PHD8 associated with cells adjacent to cell 10 and the associated transfer transistors MD5 to MD8 have been shown. Each photodiode PHD1 to PHD4 is formed at the level of an active area 12, for example, of a first conductivity type, for example, type N, at the level of which is also formed the source region of transfer transistor MD1 to MD4. Each active area 12 extends in an active area 14 of the opposite conductivity type, for example, type P, which corresponds to the channel of transfer transistor MD1 to MD4. An active N-type region 16 connects the four P-type active areas 14 and corresponds to the drain regions of transfer transistors MD1 to MD4, to node I and to the source region of transistor M1. Active area 16 extends successively into a P-type active area 18 and an N-type active area 20. Active areas 18 and 20 respectively correspond to the channel and to the drain region of transistor M1. Cell 10 comprises an N-type active area 22 which successively extends into a P-type active area 24, an N-type active area 26, a P-type active area 28, and an N-type active area 30. Active areas 22, 24, 26, 28, and 30 successively correspond to the source region of transistor M3, to the channel of transistor M3, to the channel of transistor M3, to the drain region of transistor M3 (and to the source region of transistor M2), to the channel of transistor M2, and to the drain region of transistor M2. For each photodiode PHD1 to PHD4, cell 10 comprises a polysilicon portion 32 at the level of which is formed the gate of transfer transistor MD1 to MD4. Cell 10 also comprises three polysilicon portions 34, 36, 38 at the level of which are respectively formed the gates of transistors M1, M2, and M3. Portion 36 is connected to node I by metal portions not shown. According to such an arrangement of the photodetector cells, groups of four adjacent photodiodes belonging to two different cells are obtained, the groups being separated by MOS transistors for charging and reading from a cell.

The color detection is obtained by associating with each photodiode of a cell a colored filter, not shown, which only lets through the light rays having a wavelength within a given range. Three types of filters corresponding to the three primary colors (red, green, blue) are generally obtained. An example of distribution of the colored filters corresponds to the Bayer pattern according to which for each group of four adjacent photodiodes, for example, PHD1, PHD2, PHD5, and PHD6, green filters are associated with photodiodes PHD1 and PHD6, a blue filter is associated with photodiode PHD5, and a red filter is associated with photodiode PHD2. Similarly, for the groups of four adjacent photodiodes PHD3, PHD7, PHD4, and PHD8, green filters are associated with photodiodes PHD7 and PHD4, a blue filter is associated with photodiode PHD3, and a red filter is associated with photodiode PHD8. Such a pattern is reproduced for all the image sensor cells.

FIG. 3 is a partial simplified cross-section view of FIG. 2 along line III-III and illustrates an embodiment in monolithic form of photodiodes PHD5, PHD1, PHD4, and PHD8. The polysilicon portions of FIG. 2 are not shown. The photodiodes are formed in a same active area of a semiconductor region 50 of a first conductivity type, for example, lightly P-type doped ($P^{--}$). Substrate 50 for example corresponds to an epitaxial layer on heavily-doped P-type silicon wafer 52 ($P^{++}$). The active areas associated with photodiodes PHD5, PHD1, PHD4, and PHD8 are delimited by field insulation areas 54, for example, made of silicon oxide ($SiO_2$). Each photodiode comprises an active region 56 of the opposite conductivity type, for example, N. Active region 56 is interposed between an overlying heavily-doped P-type region 58 ($P^+$) and an underlying P-type region 60 ($P^-$), more heavily doped than substrate 50 but less heavily doped than region 58. Between the field insulation region 54 located to the right of photodiode PHD1 and the field insulation region 54 located to the left of photodiode PHD4, a heavily-doped N-type active area 62 ($N^+$) and an underlying P-type region 64 ($P^-$) are provided. Around each field insulation region 54 is provided a heavily-doped P-type region 66 ($P^+$) enabling connecting region 58 to the reference voltage of the cell via substrate 50.

In operation, the heavily-doped P-type regions 58, 66, and 52 are substantially permanently maintained at the reference voltage or ground, for example, 0 V. In the absence of light, active region 56 of each photodiode reaches a so-called depletion quiescent level (positive) set by the features of the diode. Active region 56 then forms of potential well which fills according to the photodiode lighting, causing a decrease in the voltage of region 56. Indeed, when photons enter a photodiode, they cause the forming of electron-hole pairs. The holes are carried off by wafer 52 while the electrons are attracted by the potential well present at the level of region 56. Each photodiode PDH5, PHD1, PHD4, and PHD8 is of so-called totally depleted type to suppress any noise at the photodiode level. For this purpose, the doping profiles are selected so that active region 56, pinched between surface region 58 and underlying region 60, is depleted. The potential in depletion regime, that is, in the absence of a radiation, is adjusted by the dopings of regions 56, 58, and 60 only.

Generally, the photodiodes have an identical structure which is optimized to have the best quantic output independently from the wavelength of the light rays which reach the photodiodes. The photons having a wavelength corresponding to blue, to green, and to red being absorbed down to depths respectively on the order of 1, 2, and 3 micrometers, it is necessary to provide, for each photodiode, a photon absorption area, that is, a thickness of substrate 50 under active region 56, with a depth of at least 3 micrometers whatever the type of filter associated with the photodiode.

The current trend is to decrease the lateral dimensions of the image sensors made in monolithic form. When lateral dimensions of the photodiodes become smaller than the absorption depth, that is, approximately 3 micrometers, the phenomena of minority carrier diffusion are no longer negligible and result in a very strong degradation of the image sensor resolution. Indeed, the photons absorbed at the level of the portion of substrate 50 located under active region 56 associated with a given photodiode may cause the forming of electrons which are caught, due to the diffusion, by the photodiode regions 56 adjacent to the given photodiode. This phenomenon, called diffusion video crosstalk, significantly degrades the sensor resolution since electrons originating from photons of a determined wavelength may be captured by a photodiode receiving photons of another wavelength.

Such a disadvantage can be avoided by insulating the portions of substrate 50 located under regions 56 associated with each photodiode. For this purpose, each field insulation region 54 could be extended by a heavily-doped P-type region, which would extend to wafer 52. It would be desirable to be able to form such a region with conventional integrated circuit manufacturing techniques, for example, by implantation steps. However, the width of such a P-type region should be substantially identical to the width of a field insulation region 54, that is, on the order of from 0.4 to 0.5 micrometer. Since such a region should extend down to a 3-micrometer depth, it should be formed by implantation with high energies, greater than 1 Megaelectronvolt. To perform such an implantation, it is then necessary to form resin portions on the monolithic circuit having a thickness greater than 4 micrometers and spaced apart by 0.4 micrometer. This cannot be done with techniques compatible with industrial integrated circuit manufacturing methods.

SUMMARY OF THE INVENTION

The present invention aims at a specific monolithic image sensor structure enabling decreasing the crosstalk diffusion phenomenon and which may be formed by conventional integrated circuit manufacturing techniques.

In one embodiment, the invention provides a photodetector made in monolithic form in a lightly-doped substrate of a first conductivity type, this photodetector comprising at least two photodiodes, and comprising a first region of the first conductivity type more heavily doped than the substrate extending at least between the two photodiodes; and a second region of the first conductivity type more heavily doped than the substrate and extending under the first region and under one of the two photodiodes, the first region or the second region, with the first region, delimiting a substrate portion at the level of said one of the two photodiodes, and the second region, with the first region, delimiting an additional substrate portion at the level of the other one of the two photodiodes.

According to an example of embodiment of the present invention, the photodetector comprises at least one group of first, second, and third photodiodes intended to receive light rays respectively having first, second, and third wavelengths, the first wavelengths being shorter than the second wavelengths and the second wavelengths being shorter than the third wavelengths. The first region extends under the first photodiode and delimits a first substrate portion at the level of the first photodiode, and also extends at least between the second and third photodiodes, and the second region extends under the first region and under the first and second photodiodes, the second region delimiting, with the first region, a second substrate portion at the level of the second photodiode and a third substrate portion at the level of the third photodiode.

According to an example of embodiment of the present invention, the second region is more heavily doped than the first region.

According to an example of embodiment of the present invention, the first substrate portion has a first depth, the second substrate portion has a second depth, and the third substrate portion has a third depth, the third depth being greater than the second depth and the second depth being greater than the first depth.

According to an example of embodiment of the present invention, the first and second regions are shifted with respect to the second and third photodiodes, whereby the second and third substrate portions have a general shape inclined with respect to a surface of the photodetector.

According to an example of embodiment of the present invention, the photodetector comprises an array of groups of the first, second, and third photodiodes. For each group of photodiodes, the first and second regions are shifted with respect to the second and third photodiodes, the shift depending on the position of the group in the array, whereby the second and third substrate portions have a shape generally inclined with respect to a surface of the photodetector, the inclination of which depends on the position of the group in the array.

According to an example of embodiment of the present invention, the shift is zero at the center of the array and increases along with the distance from the center of the array.

The present invention also provides a method for manufacturing a monolithic photodetector, comprising the steps of:

(a) forming a substrate of a first conductivity type;

(b) forming in the substrate, by a first implantation performed with a first energy level, a first region of the first conductivity type more heavily doped than the substrate at least between two locations, and forming in the substrate, by a second implantation performed with a second energy level greater than the first energy level, a second region of the first conductivity type more heavily doped than the substrate under the first region and under one of the two locations; and (c) forming a photodiode at the level of one of the two locations and another photodiode at the level of the other one of the two locations, whereby the first region or the second region, with the first region, delimits a substrate portion at the level of the photodiode formed at the level of said one of the two locations and the second region delimits, with the first region, an additional substrate portion at the level of said other photodiode.

According to an example of embodiment of the present invention, step (b) comprises the forming of the first region under a first location and at least between second and third locations and the forming of the second region under the first region and under the first and second locations, and step (c) comprises the forming of a first photodiode at the level of the first location, a second photodiode at the level of the second location, and a third photodiode at the level of the third location, the first, second, and third photodiodes being intended to receive light rays respectively having first, second, and third wavelengths, the first wavelengths being shorter than the second wavelengths and the second wavelengths being shorter than the third wavelengths, whereby the first region delimits a first substrate portion at the level of the first photodiode and the second region delimits, with the first region, a second substrate portion at the level of the second photodiode and a third substrate portion at the level of the third photodiode.

According to an example of embodiment of the present invention, the first implantation is performed with a first dose and the second implantation is performed with a second dose, the second dose being greater than the first dose.

According to an example of embodiment of the present invention, at least one of the first region or of the second region is formed by several successive implantations with different energy levels.

According to an example of embodiment of the present invention, the first and second regions are formed in shifted fashion with respect to the second and third photodiodes, whereby the second and third substrate portions have a general shape inclined with respect to a surface of the photodetector.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 1 is an electric diagram of a cell of an image sensor;

FIG. 2 is a partial simplified top view of an example of a conventional example of monolithic embodiment of the circuit of FIG. 1;

FIG. 3 is a simplified cross-section view of the circuit of FIG. 2 along line 3-3;

FIG. 6 is a simplified cross-section view of a second example of embodiment of an image sensor according to the present invention; and FIG. 7 is a simplified cross-section view of a third example of embodiment of an image sensor according to the present invention.

DETAILED DESCRIPTION

Figure 4:
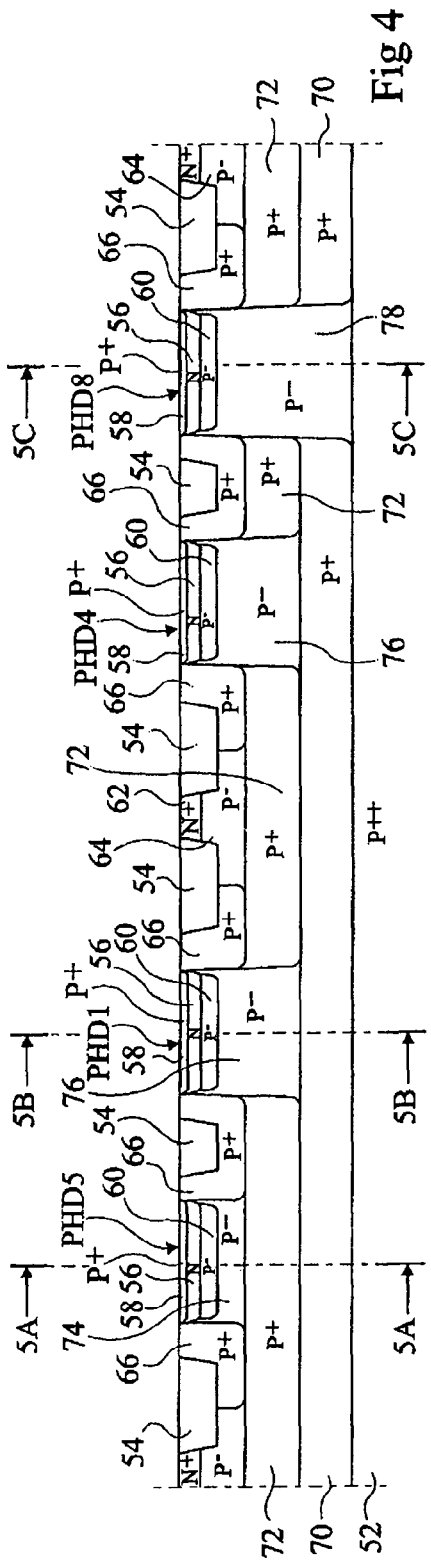
FIG. 4 is a simplified cross-section view of a first example of embodiment of an image sensor according to the present invention.

For clarity, the same elements have been designated with the same reference numerals in the different drawings and, further, as usual in the representation of integrated circuits, the various drawings are not to scale.

The present invention is based on the fact that the photodiodes of an image sensor distributed according to the Bayer pattern are arranged in groups of four, each group comprising two photodiodes associated with green, a photodiode associated with blue, and a photodiode associated with red. The present invention is also based on the fact that the maximum photon absorption depth is different according to the wavelength. Indeed, for colors red, blue, and green, the photons can be absorbed down to depths on the order of 3 micrometers, 2 micrometers, and 1 micrometer. The present invention provides forming an insulation cage at the level of each photodiode which has a specific structure for each photodiode associated with a specific color. The circuit structure at the level of the substrate in which the photodiodes are formed is then no longer symmetrical.

More specifically, the present invention provides forming by high-energy implantation at least one deep region of the same conductivity type as the substrate, for example, type P, heavily doped, substantially extending over the entire circuit except at least at the level of each photodiode associated with red and forming at least one shallow region of the same conductivity type as the substrate, for example, type P, heavily doped, obtained by at least one implantation at lower energy extending substantially under the photodiodes associated with blue and surrounding each photodiode associated with red.

A lightly-doped P-type substrate portion is thus obtained:
for each photodiode associated with blue, delimited by a shallow P-type region, heavily doped, extending under the photodiode;
for each photodiode associated with green, delimited by a first deep P-type region, heavily doped, extending under the photodiode and a second shallower heavily-doped P-type region surrounding the lightly-doped P-type substrate portion associated with the photodiode; and
for each photodiode associated with red, delimited by a first heavily-doped deep P-type region, surrounding the lightly-doped P-type substrate portion associated with the photodiode and a second shallower heavily-doped P-type region substantially surrounding the lightly-doped P-type substrate portion associated with the photodiode.

The lightly-doped substrate portions thus delimited then have a depth adapted to the color of the filter associated with the photodiode.

The heavily-doped P-type regions formed at high depth (from 2 to 3 micrometers) by high-energy implantation, for example, on the order of 1 Megaelectronvolts, have a sufficient extent and lateral spacing to be easy to form by conventional monolithic circuit manufacturing methods. In particular, such regions have a minimum width corresponding to the width of at least one diode (that is, at least 1 micrometer) and are spaced apart at least by the width of a diode. The heavily-doped P-type regions having the smallest lateral width and/or lateral spacing are formed at small depth (from 1 to 2 micrometers), and are formed by implantation with lower energy levels, for example, on the order of 500 Kiloelectronvolts. Such a implantation requires forming on the circuit resin portions having a thickness on the order of 2 micrometers and spaced apart at least by the width of a field insulation region, that is, on the order of 0.4 micrometer. This is compatible with industrial integrated circuit manufacturing processes.

FIG. 4 is a simplified cross-section view, similar to the cross-section of FIG. 3, of a first example of embodiment of an image sensor according to the present invention. As an example, the average distance between two insulation regions 54 on either side of a photodiode is on the order of 1.2 micrometers. According to the first example of embodiment, a heavily-doped P-type region 70 ($P^+$) formed at depths on the order of from 2 to 3 micrometers is provided, which substantially extends under all the circuit elements, except for the photodiodes associated with red, that is, photodiode PHD8 in FIG. 4. Region 70 is, for example, formed by implantation with a 1100-keV energy and a dose from $10^{13}$ to $10^{14}$ atoms/$cm^2$. A heavily-doped P-type region 72 which is formed at depths on the order of from 1 to 2 micrometers and which substantially extends under all the circuit elements, except for the photodiodes associated with green and red, that is, photodiodes PHD1, PHD4, and PHD8 in FIG. 4, is also provided. Region 72 is, for example, formed by implantation with a 550-keV energy and a dose from $10^{13}$ to $10^{14}$ atoms/$cm^2$. Regions 70 and 72 form isolation cages at the level of each photodiode and delimit a lightly-doped P-type portion 74 ($P^{--}$) of substrate 50 at the level of each photodiode associated with blue (that is, photodiode PHD5 in FIG. 4), a lightly-doped P-type portion 76 ($P^{--}$) of substrate 50, deeper than portion 74, at the level of each photodiode associated with green (that is, photodiodes PHD1 and PHD4 in FIG. 4), and a lightly-doped P-type portion 78 ($P^{--}$) of substrate 50, deeper than portion 76, at the level of each photodiode associated with red (that is, photodiode PHD8 in FIG. 4).

Figure 5C:
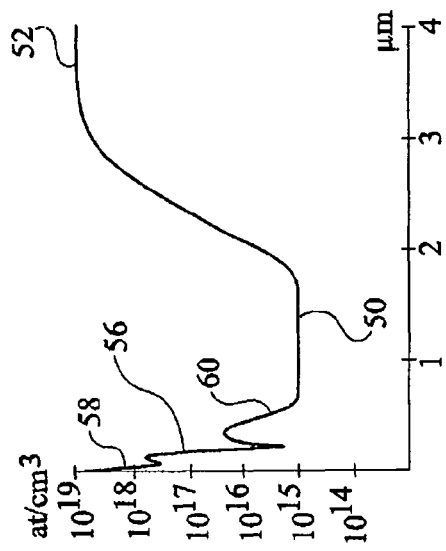
FIGS. 5A to 5C illustrate doping levels in the structure of FIG. 4 respectively along lines 5A-5A, 5B-5B, and 5C-5C.
Figure 5B:
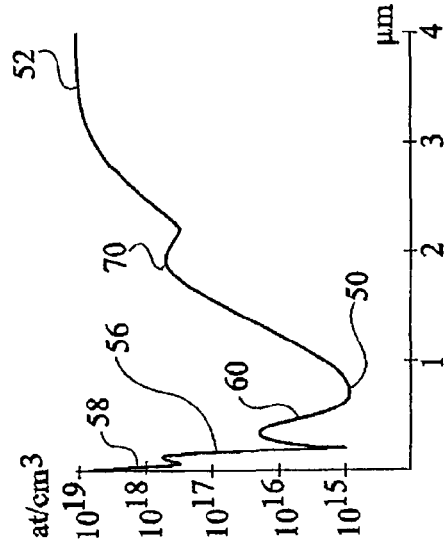
Figure 5A:
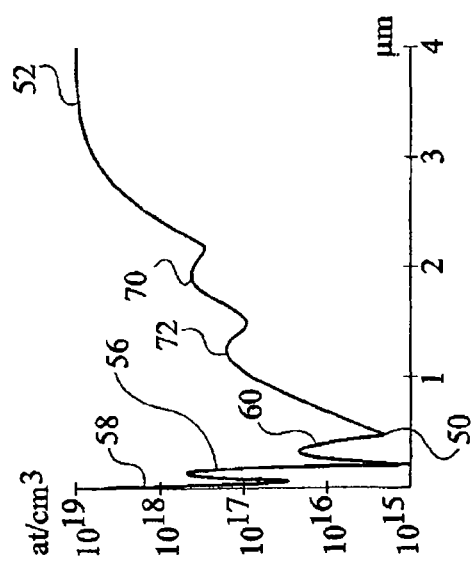

FIGS. 5A to 5C illustrate the doping levels in the structure of FIG. 4 respectively along lines 5A-5A, 5B-5B, and 5C-5C with the previously-described implantation examples.

The present invention enables local decrease of the voltage vertically above each field insulation region 54. Thereby, when an electron is formed in one of lightly-doped P-type portions 74, 76, 78 located under a given photodiode, it is attracted towards increasing voltages, that is, towards N-type active region 56 of this same photodiode. Indeed, regions 70 and 72 cause the forming of an electrostatic field which opposes a displacement of such an electron towards a photodiode adjacent to the given photodiode. The present invention thus enables, by providing judiciously-distributed dopant concentration gradients, obtaining the forming of electrostatic fields which channel electron displacements towards the right photodiode. The applicant has shown that the greater the dopant concentration of regions 70 and 72, the greater the obtained electrostatic fields, which further improves the electron channeling phenomenon.

According to a variation of the first example of embodiment, it is possible for region 72 not to extend under the entire central portion of the cell where transistors M1, M2, and M3 are formed. Indeed, it is possible to form region 72 only under the field insulation region 54 just adjacent to photodiode PHD8 associated with red (field insulation region 54 to the far right in FIG. 4) or only under the field insulation region 54 just adjacent to photodiode PHD5 associated with blue (field insulation region 54 to the far left in FIG. 4). According to such a variation, there always is a partition of the lightly-doped P-type substrate into portions 74, 76, and 78 associated with each photodiode, while enabling the photodiodes associated with green to recover electrons which would have formed under the central portion of the cell where transistors M1, M2, and M3 are formed. Similarly, for two photodiodes respectively associated with green and with red and arranged on either side of the central portion of the cell where transistors M1, M2, and M3 are formed, it can be provided to only extend region 72, and underlying region 70, to the field insulation region 54 adjacent to the photodiode associated with green and not under the entire central portion of the cell where transistors M1, M2, and M3 are formed. According to such a variation, there always is a partitioning of the lightly-doped P-type substrate into portions 74, 76, and 78 associated with each photodiode while, at the means time, the photodiodes associated with red are able to recover electrons which would have formed under the central portion of the cell where transistors M1, M2, and M3 are formed.

FIG. 6 is a simplified cross-section view, similar to the cross-section view of FIG. 4, of a second example of embodiment of an image sensor according to the present invention. As compared with the first example of embodiment, region 72 is replaced with two P-type regions 80, 82, substantially superposed, and having different dopant concentrations. As an example, region 82 is obtained by an implantation performed with a 450-keV energy and a $3*10^{13}$-atoms/$cm^2$ dose, and region 80 is obtained by an implantation performed with a 800-keV energy and a $5*10^{13}$-atoms/$cm^2$ dose. Region 70 is obtained, for example, by an implantation performed with 1100-keV energy and a $8*10^{13}$-atoms/$cm^2$ dose. Generally, regions 70 and 72 may correspond to stackings of several P-type regions obtained by implantations performed with different energies and doses.

FIG. 7 is a simplified cross-section view, similar to the cross-section view of FIG. 4, of a third example of embodiment of an image sensor according to the present invention. In the third example of embodiment, regions 70 and 72 are laterally shifted with respect to the first example of embodiment. In FIG. 7, regions 70 are more strongly shifted to the right than regions 72. Lightly-doped P-type portions 76, 78 ($P^{--}$) delimited by regions 70, 72 and associated with photodiodes PHD1, PHD4, and PHD8 then have a generally inclined shape.

The third example of embodiment is adapted to the case where the light rays which reach the photodiodes are not perpendicular to the upper surface of the image sensor but are inclined with respect to the upper surface of the image sensor. Indeed, with the structure of FIG. 4, rays reaching a given photodiode with a significant inclination risks causing the forming of electrons at the level of another region than lightly-doped P-type portion 74, 76, and 78 ($P^{--}$) associated with the given photodiode, such electrons then risking to be conveyed to another photodiode. The risk increases along with the maximum travel length of the photon in substrate 50. The third example of embodiment enables obtaining portions 74, 76, and 78 associated with the photodiodes receiving "green" and "red" light rays which have a general inclination equal to the expected inclination of the light rays. Thereby, the forming of electrons is preferentially obtained in the portion 76, 78 associated with each photodiode and such electrons are channeled to the corresponding photodiode by the electrostatic fields which are present, as described previously.

As an example, for an image sensor formed of an array of cells, the light rays which reach the cells located in the central region of the image sensor are generally perpendicular to the upper surface of the image sensor while the light rays which reach the cells located at the periphery of the image sensor are generally inclined with respect to the upper surface of the image sensor. In this case, the lateral shift of regions 70 and 72 can advantageously depend on the position of the cell in the cell array and increase from the center to the periphery of the image sensor.

According to an alternative embodiment of the present invention, it may be preferable to apply the previously-described structure associated with the photodiode receiving "red" light rays to the photodiode receiving "green" light rays, while the previously-described structure associated with the photodiode receiving "blue" or "green" light rays is applied to the photodiode receiving "red" light rays. In other words, according to such a variation, with respect to FIG. 4, the structure associated with photodiode PHD8 is applied to the photodiode receiving "green" light rays while the structure associated with photodiode PHD5 or PHD1 is applied to the photodiode receiving "red" light rays. Such a variation may be advantageous when the signals provided by the photodiodes receiving "green" light rays, are desired to be privileged, such signals being more critical for an image sensor. Indeed, according to such a variation, the substrate portion associated with the photodiode receiving "green" light rays is the deepest so that that the electron capture by such a photodiode is favored.

Of course, the present invention is likely to have various alterations, modifications, and improvements which will readily occur to those skilled in the art. In particular, it will be within the abilities of those skilled in the art to adjust the doping levels and types to the desired performances and the used materials according to the constraints of a specific manufacturing technology.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photodetector made in monolithic form in a lightly-doped substrate of a first conductivity type, the photodetector comprising:
   at least first, second and third photodiodes adapted to receive light rays respectively having first, second and third wavelengths, the first wavelengths being shorter than the second wavelengths and the second wavelengths being shorter than the third wavelengths;
   a first region of the first conductivity type more heavily doped than the substrate extending under the first photodiode and delimiting a first substrate portion under the first photodiode, and also extending at least between the second and third photodiodes; and
   a second region of the first conductivity type more heavily doped than the substrate and extending under the first region and under the first and second photodiodes, the second region delimiting, with the first region, a second substrate portion under the second photodiode and a third substrate portion under the third photodiode, wherein the first substrate portion has a first depth, the second substrate portion has a second depth, and the third substrate portion has a third depth, the third depth being greater than the second depth and the second depth being greater than the first depth.

2. The photodetector of claim 1, wherein the second region is more heavily doped than the first region.

3. The photodetector of claim 1, wherein the first and second regions are shifted with respect to the second and third photodiodes, whereby the second and third substrate portions have a shape generally inclined with respect to a surface of the photodetector.

4. The photodetector of claim 1, comprising an array of groups of the first, second, and third photodiodes, wherein, for each group of photodiodes, the first and second regions are shifter with respect to the second and third photodiodes, the shift portions have a shape generally inclined with respect to a surface of the photodetector, the inclination of which depends on the position of the group in the array.

5. The photodetector of claim 4, wherein the shift is zero at the center of the array and increases along with the distance from the center of the array.

6. A monolithic photodetector comprising:
   a lightly-doped substrate of a first conductivity type;
   at least first, second and third photodiodes adapted to receive light having first, second and third wavelengths, respectively, the first wavelengths being shorter than the second wavelengths and the second wavelengths being shorter than the third wavelengths;
   a first region of the first conductivity type, more heavily doped than the substrate, located under the first photodiode and defining a first substrate portion under the first photodiode, and also located between the second and third photodiodes; and
   a second region of the first conductivity type, more heavily doped than the substrate, located under the first region and under the first and second photodiodes, the first region and the second region defining a second substrate portion under the second photodiode and a third substrate portion under the third photodiode, wherein the first substrate portion has a first depth, the second substrate portion has a second depth and the third substrate portion has a third depth, the third depth being greater than the second depth and the second depth being greater than the first depth.

7. A photodetector as defined in claim 6, wherein the second region is more heavily doped than the first region.

8. A photodetector as defined in claim 6, wherein the first and second regions are laterally shifted with respect to the second and third photodiodes.

9. A photodetector as defined in claim 6, comprising an array of groups of the first, second and third photodiodes, wherein, for each group of photodiodes, the first and second regions are laterally shifted with respect to the second and third photodiodes, and the amount of shift depends on a position of the group in the array.

10. A photodetector as defined in claim 9, wherein the amount of shift is zero at a center of the array and increases with distance from the center of the array.

* * * * *

UNITED STATES PATENT AND TRADEMARK OFFICE
CERTIFICATE OF CORRECTION

| | | |
|---|---|---|
| PATENT NO. | : 7,964,928 B2 | Page 1 of 1 |
| APPLICATION NO. | : 11/602053 | |
| DATED | : June 21, 2011 | |
| INVENTOR(S) | : François Roy et al. | |

It is certified that error appears in the above-identified patent and that said Letters Patent is hereby corrected as shown below:

Claim 3, col. 10, line 10 should read:
have a general shape inclined with respect to a surface of the Claim 4, col. 10, line 15 should read:
shifted with respect to the second and third photodiodes, the line 16 should read:
shift depending on the position of the group in the array, whereby the second and third substrate portions have a shape generally inclined with respect to Signed and Sealed this
Sixteenth Day of August, 2011

David J. Kappos
*Director of the United States Patent and Trademark Office*